US012706170B2

(12) United States Patent
Hu et al.

(10) Patent No.: US 12,706,170 B2
(45) Date of Patent: Aug. 11, 2026

(54) DETECTING EXTRINSIC BITLINE DEFECTS

(71) Applicant: Micron Technology, Inc., Boise, ID (US)

(72) Inventors: Tingjun Hu, Singapore (SG); Wai Leong Chin, Singapore (SG); Chia Yu Kuo, Hukou Town (TW)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 18/932,023

(22) Filed: Oct. 30, 2024

(65) Prior Publication Data

US 2025/0166718 A1 May 22, 2025

Related U.S. Application Data

(60) Provisional application No. 63/600,296, filed on Nov. 17, 2023.

(51) Int. Cl.

| | |
|---|---|
| ***G11C 29/42*** | (2006.01) |
| ***G11C 16/08*** | (2006.01) |
| ***G11C 16/34*** | (2006.01) |
| ***G11C 29/02*** | (2006.01) |

(52) U.S. Cl.
CPC ............ *G11C 29/022* (2013.01); *G11C 16/08* (2013.01); *G11C 16/349* (2013.01); *G11C 29/42* (2013.01)

(58) Field of Classification Search
CPC ..................................................... G11C 29/42
See application file for complete search history.

(56) References Cited

U.S. PATENT DOCUMENTS

2021/0383888 A1* 12/2021 Yamamoto ............ G11C 29/42

* cited by examiner

*Primary Examiner* — Jason Lappas
(74) *Attorney, Agent, or Firm* — Schwegman Lundberg & Woessner, P.A.

(57) ABSTRACT

Aspects of the present disclosure configure a memory sub-system controller to detect extrinsic bitline defects. The controller stores a set of data in a set of memory components and performs a set of memory operations for detecting an empty page in a portion of the set of memory components. The controller determines, based on performing the set of memory operations, that the portion of the set of memory components is associated with an extrinsic bitline defect. The controller, in response to determining that the portion of the set of memory components is associated with the extrinsic bitline defect, prevents write operations to the portion of the set of memory components.

20 Claims, 6 Drawing Sheets

DETECTING EXTRINSIC BITLINE DEFECTS

PRIORITY APPLICATION

This application claims the benefit of priority to U.S. Provisional Application Ser. No. 63/600,296, filed Nov. 17, 2023, which is incorporated herein by reference in its entirety.

TECHNICAL FIELD

Examples of the disclosure relate generally to memory sub-systems and, more specifically, to providing adaptive media management for memory components, such as memory dies.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
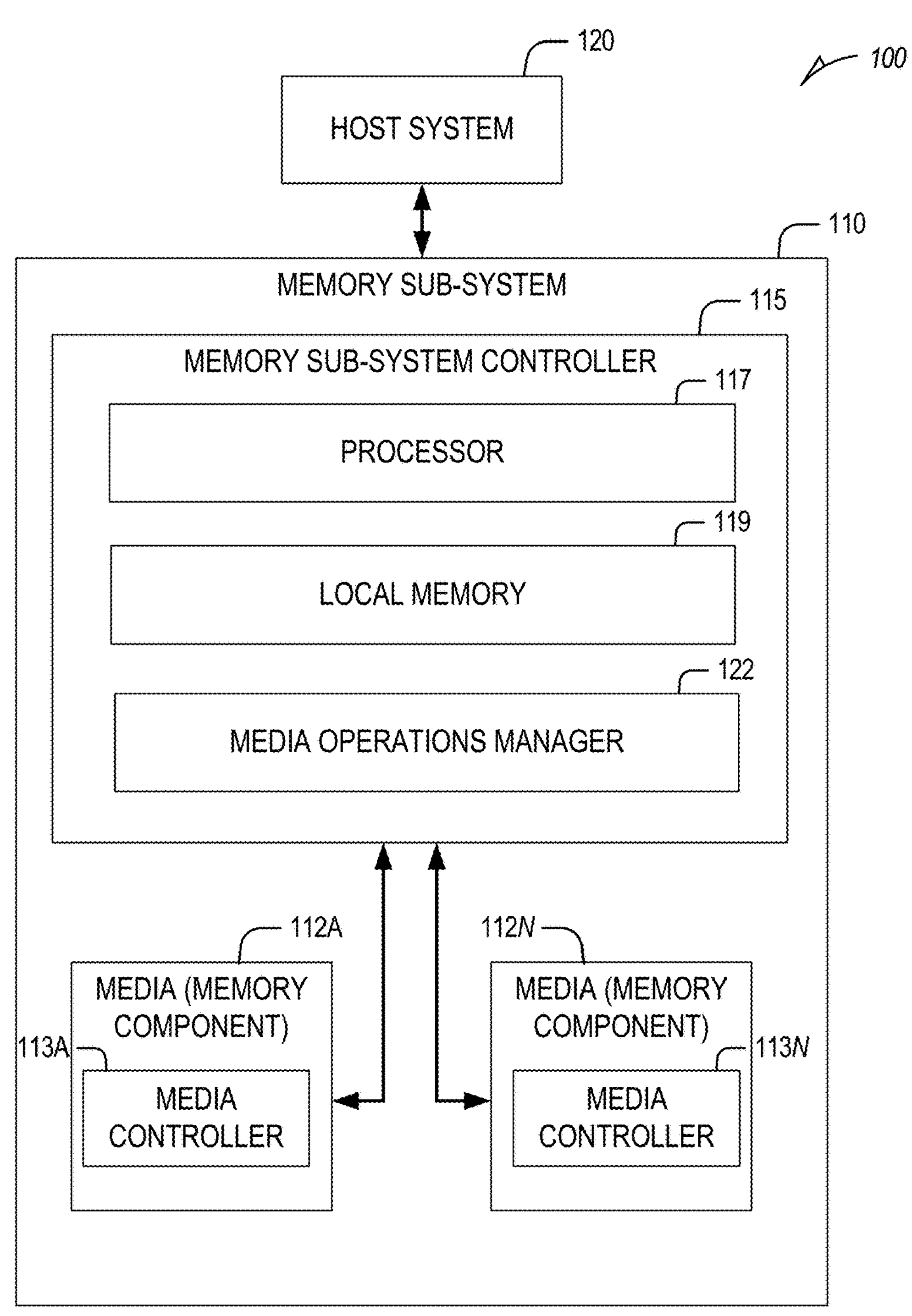
FIG. 1 is a block diagram illustrating an example computing environment including a memory sub-system, in accordance with some examples of the present disclosure.

Aspects of the present disclosure configure a system component, such as a memory sub-system controller, to identify memory portions with extrinsic bitline defects. Specifically, the memory controller can track a frequency at which one or more memory portions are folded, such as when one or more memory operations are performed on the one or more memory portions. The memory operations can include NAND detect empty page (NDEP) operations. When the frequency of the memory operations performed on the same memory portions or group of memory portions (e.g., quantity of times the memory operations are performed within a specified period of time) transgresses a threshold, the controller can measure the bit error rate associated with that portion. If the bit error rate transgresses a threshold, the one or more memory portions (e.g., memory page) are marked bad to prevent future writes to the one or more memory portions.

Specifically, such memory portions can be determined to contain extrinsic bitline defects. This improves the overall efficiency of operating the memory sub-system. Namely, writing data to memory portions that include extrinsic bitline defects can result in charge gain and NDEP operations being performed too many times which wastes system resources and reduces the overall efficiency of the device. Identifying such memory portions that contain extrinsic bitline defects and preventing writing to those portions avoids having to perform unnecessary NDEP operations which would otherwise consume and waste system resources.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data".

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data". "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which combines a raw memory device with a locally embedded controller for memory management within the same memory device package.

Typical memory systems perform NDEP operations (e.g., NDEP fold operations) on memory pages/blocks which contain undesired charge gain. Such NDEP operations refresh or rewrite the memory pages/blocks to address the undesired charge gain. Certain memory pages/blocks can be associated with extrinsic bitline defects, such as open bitlines or stuck bitlines that prevent the portions of the set of memory components from being placed into an erased state. In such cases, multiple NDEP operations continue being performed in an attempt to correct the charge gain introduced in the memory pages/blocks. However, because the memory pages/blocks have extrinsic bitline defects, the NDEP operations continue failing and are repeatedly performed. This can reduce the efficiency of operation of the memory devices and consumes unnecessary system resources.

Aspects of the present disclosure address the above and other deficiencies by providing a memory controller that can identify such memory blocks/pages/portions that are associated with extrinsic bitline defects. The identified portions are marked bad to prevent future or further writes to the memory portions. This avoids having to unnecessarily perform NDEP operations (e.g., memory operations) which do not repair the stored data. Specifically, the memory controller can track a frequency at which NDEP operations are performed on one or more memory portions. When the frequency of the memory operations performed on the same memory portions or group of memory portions (e.g., quantity of times the memory operations are performed within a specified period of time) transgresses a threshold, the controller can measure the bit error rate associated with that portion, such as after performing an erase operation on the memory portion. If the bit error rate transgresses a threshold, the one or more memory portions (e.g., memory page) are marked bad to prevent future writes to the one or more memory portions.

In some examples, the memory controller stores a set of data in the set of memory components. The memory controller performs a set of memory operations for detecting an empty page in a portion of the set of memory components and determines, based on performing the set of memory operations, that the portion of the set of memory components is associated with an extrinsic bitline defect. The memory controller, in response to determining that the portion of the set of memory components is associated with the extrinsic bitline defect, prevents write operations to the portion of the set of memory components.

In some examples, the memory controller marks the portion of the set of memory components as a bad block. In some cases, the extrinsic bitline defect corresponds to an open bitline or a stuck bitline that prevents the portion of the set of memory components from being placed into an erased state. In some cases, the extrinsic bitline defect causes undesired charge gain in the portion of the set of memory components. In some examples, the extrinsic bitline defect causes a high reliability error rate (HRER) to be introduced in the portion of the set of memory components. In some cases, the HRER is associated with uncorrectable errors in the set of data stored in the portion of the set of memory components.

In some examples, the set of memory operations includes a NAND detect empty page (NDEP) operation. In some cases, the NDEP operation reads a block of data to detect charge gain and refreshes the block of data.

In some examples, the memory controller accesses configuration information associated with the set of memory components and processes the configuration information to identify a plurality of portions of the set of memory components that are associated with a certain likelihood of having extrinsic bitline defects. The memory controller stores a counter in association with the plurality of portions to represent frequency of performing the set of memory operations on the plurality of portions of the set of memory components.

In some examples, the memory controller determines that the portion of the set of memory components is included in the plurality of portions of the set of memory components that are associated with the certain likelihood of having extrinsic bitline defects. In some examples, the memory controller sets a time period in association with updating the counter and increments the counter each time an individual memory operation of the set of memory operations is performed in relation to the plurality of portions of the set of memory components within the time period.

In some examples, the counter is reset when the time period expires. In some examples, the memory controller determines that the counter transgresses a threshold value before expiration of the time period. The memory controller, in response to determining that the counter transgresses the threshold value, stores a flag in association with the plurality of portions, the flag corresponding to an instruction to perform an additional one of the set of memory operations after erasing an individual portion of the plurality of portions.

In some examples, the memory controller, after performing an individual memory operation of the set of memory operations on the portion of the set of portions, determines that the portion is associated with the counter that transgresses the threshold value. The memory controller, in response to determining that the portion is associated with the counter that transgresses the threshold value, performs the additional one of the set of memory operations after erasing the portion of the plurality of portions and computes an error rate associated with performing the additional one of the set of memory operations on the portion of the set of memory components.

In some examples, the memory controller determines that the error rate transgresses a maximum error rate threshold; and in response to determining that the error rate transgresses the maximum error rate threshold, marking the portion as a bad portion to prevent the write operations to the portion of the set of memory components. In some cases, the plurality of portions correspond to a first bin, the counter is a first counter, and the memory controller associates the first bin with the first counter. The memory controller identifies, based on the configuration information, a second bin of a second plurality of portions of the set of memory components that is associated with the certain likelihood of having extrinsic bitline defects and associates the second bin with a second counter to represent frequency of performing the set of memory operations on the second plurality of portions of the set of memory components of the second bin.

In some examples, a set of registers for storing addresses in which the set of memory operations have been performed within a specified time period are provided and the memory controller determines that an individual address corresponding to the portion of the set of memory components is duplicated in the set of registers. The memory controller, in response to determining that the individual address corresponding to the portion of the set of memory components is duplicated in the set of registers, performs an additional one of the set of memory operations after erasing the portion of the set of memory components. The memory controller computes an error rate associated with performing the additional one of the set of memory operations on the portion of the set of memory components.

In some cases, the memory controller determines that the error rate transgresses a maximum error rate threshold and, in response to determining that the error rate transgresses the maximum error rate threshold, marks the portion as a bad portion to prevent the write operations to the portion of the set of memory components.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies).

In some examples, the first memory component 112A, block or page of the first memory component 112A, or group of memory components including the first memory component 112A can be associated with a first reliability (capability) grade, value or measure. The terms "reliability grade," "value" and "measure" are used interchangeably throughout and can have the same meaning. The second memory component 112N or group of memory components including the second memory component 112N can be associated with a second reliability (capability) grade, value or measure. In some examples, each memory component 112A to 112N can store respective configuration data that specifies the respective reliability grade. In some examples, a memory or register can be associated with all of the memory components 112A to 112N, which can store a table that maps different groups, bins or sets of the memory components 112A to 112N to respective reliability grades. In some cases, the table can specify bins each representing a respective plurality of portions of the memory components 112A to 112N that is associated with a certain likelihood of having extrinsic bitline defects. Namely, during manufacture, bins can be defined that group different memory components 112A to 112N (e.g., based on memory addresses). Each bin can be associated with a respective likelihood that the corresponding memory components 112A to 112N are likely to have or experience extrinsic bitline defects. These bins can be stored in configuration data associated with the memory sub-system 110.

In some examples, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL), a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe or CXL interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative- and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative- or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array.

Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data. For example, a single first row that spans memory components 112A to 112N can correspond to or be grouped as a first superblock and a single second row that spans memory components 112A to 112N can correspond to or be grouped as a second superblock. If the single first row includes all good blocks (e.g., each block in the single first row has a reliability grade above a threshold), the first superblock is a first complete superblock. If the single first row includes some bad blocks (e.g., one or more blocks in the single first row have a reliability grade below a threshold), the first superblock is a first incomplete superblock.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different NDEP operations to read a block of data to detect charge gain and refresh the block of data, different near miss ECC operations, and/or different dynamic data refresh.

The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112N to 112N. The configuration data can describe the reliability grades and/or indications of defects in certain WGRs associated with different groups of the memory components 112N to 112N and/or different blocks within each of the memory components 112N to 112N and/or different bins and respective memory components 112N to 112N that are likely to experience extrinsic bitline defects. In some cases, the reliability grades are dynamic and can be updated by the memory sub-system controller 115 in response to determining that certain error rates are reached that transgress an error rate threshold. For example, a non-defective WGR can become a defective WGR if that non-defective WGR starts having error rates that transgress the threshold. In such cases, the configuration data is updated and any VB that includes that now defective WGR is updated with a replacement or spare PGB to maintain performance of the VB above a minimum or reference performance rating.

The memory sub-system controller 115 can be responsible for other memory management operations, such as wear leveling operations, garbage collection operations, error detection and error-correcting code (ECC) operations, encryption operations, caching operations, NDEP operations, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some examples, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a media operations manager 122. The media operations manager 122 that can identify memory blocks/pages/portions that are associated with extrinsic bitline defects. The media operations manager 122 can mark such identified portions as bad to prevent future or further writes to the memory portions. This avoids having to unnecessarily perform NDEP operations (e.g., memory operations) which may not repair the stored data. Specifically, the media operations manager 122 can track a frequency at which one or more memory operations (e.g., NDEP fold operations) are performed on one or more memory portions. NDEP fold operations can include refreshing or rewriting data stored in one portion of memory to another portion of memory. When the frequency of the memory operations performed on the same memory portions or group of memory portions (e.g., quantity of times the memory operations are performed within a specified period of time) transgresses a threshold, the media operations manager 122 can measure the bit error rate associated with that portion, such as after performing an erase operation on the memory portion. If the bit error rate transgresses a threshold, the one or more memory portions (e.g., memory page) are marked bad to prevent future writes to the one or more memory portions.

In some cases, the memory sub-system controller 115 stores a set of data in the set of memory components. The memory sub-system controller 115 performs a set of memory operations for detecting an empty page in a portion of the set of memory components and determines, based on performing the set of memory operations, that the portion of the set of memory components is associated with an extrinsic bitline defect. The memory sub-system controller 115, in response to determining that the portion of the set of memory components is associated with the extrinsic bitline defect, prevents write operations to the portion of the set of memory components.

Depending on the example, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
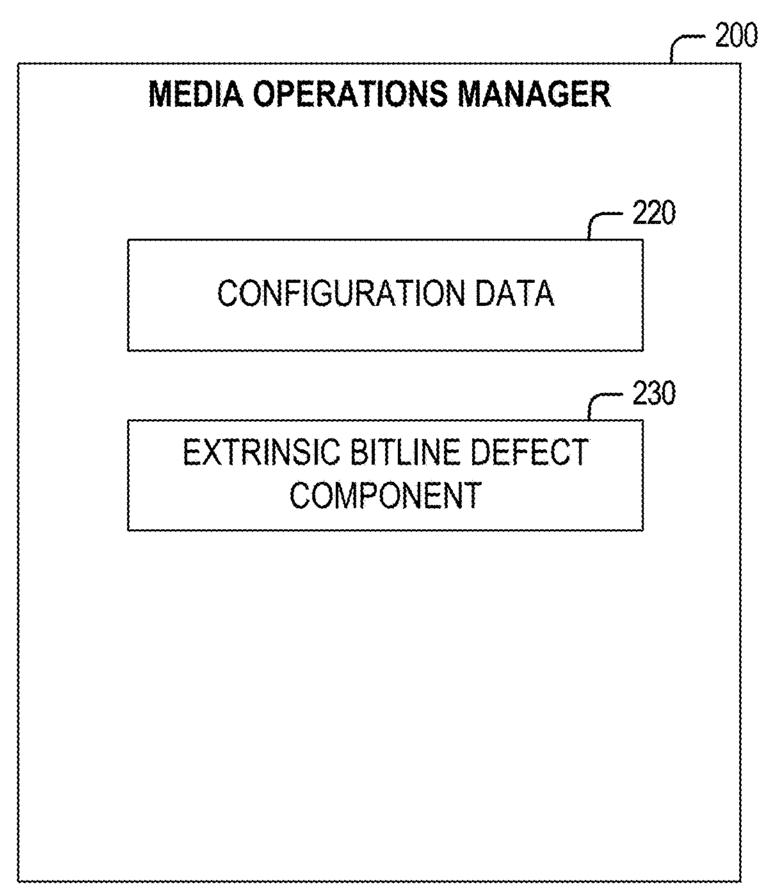
FIG. 2 is a block diagram of an example media operations manager, in accordance with some examples of the present disclosure.

FIG. 2 is a block diagram of an example media operations manager 200, in accordance with some implementations of the present disclosure. The media operations manager 200 can include some or all of the components of the media operations manager 122, shown in FIG. 1. As illustrated, the media operations manager 122 includes configuration data 220 and an extrinsic bitline defect component 230. For some examples, the media operations manager 200 can differ in components or arrangement (e.g., less or more components) from what is illustrated in FIG. 2.

The configuration data 220 accesses and/or stores configuration data associated with the memory components 112A to 112N. In some examples, the configuration data 220 is programmed into the media operations manager 122 during manufacture of the memory sub-system 110. The media operations manager 122 can communicate with the memory components 112A to 112N to obtain the configuration data and store the configuration data 220 locally on the media operations manager 122. In some examples, the media operations manager 122 communicates with the host system 120. The host system 120 receives input from an operator or user that specifies parameters including indications of defects (e.g., that can lead or be associated with extrinsic bitline defects) present on different WGRs, different bins, groups, blocks, or sets of the memory components 112A to 112N. The media operations manager 122 receives configuration data from the host system 120 and stores the configuration data in the configuration data 220.

In some examples, the extrinsic bitline defect component 230 detects an empty page in a portion of the memory components 112A to 112N, such as in response to performing one or more types of memory operations (e.g., NDEP operations). The extrinsic bitline defect component 230 can then determine that the portion of the memory components 112A to 112N is associated with an extrinsic bitline defect based on performing the one or more types of memory operations. In such cases, the extrinsic bitline defect component 230 marks the portion as bad to prevent future writes to the portion of the memory components 112A to 112N. The extrinsic bitline defect component 230 can determine that the portion of the memory components 112A to 112N is associated with the extrinsic bitline defect in one or more ways or combination of ways (e.g., based on frequency of performing one or more types of memory operations within a specified period and/or based on determining that an address or identifier of the memory portion is duplicated in a queue of registers that represent memory portion identifiers on which the one or more types of memory operations have recently been performed).

For example, the extrinsic bitline defect component 230 can determine that the portion of the memory components 112A to 112N is associated with an extrinsic bitline defect based on a frequency at which the one or more types of memory operations are performed on the portion of the memory components 112A to 112N within a specified time period. The frequency can be measured using a table 300, shown in FIG. 3. If the frequency at which the one or more types of memory operations are performed on the portion of the memory components 112A to 112N transgresses a specified threshold, the extrinsic bitline defect component 230 determines that the address or memory portion is potentially associated with the extrinsic bitline defect.

Figure 3:
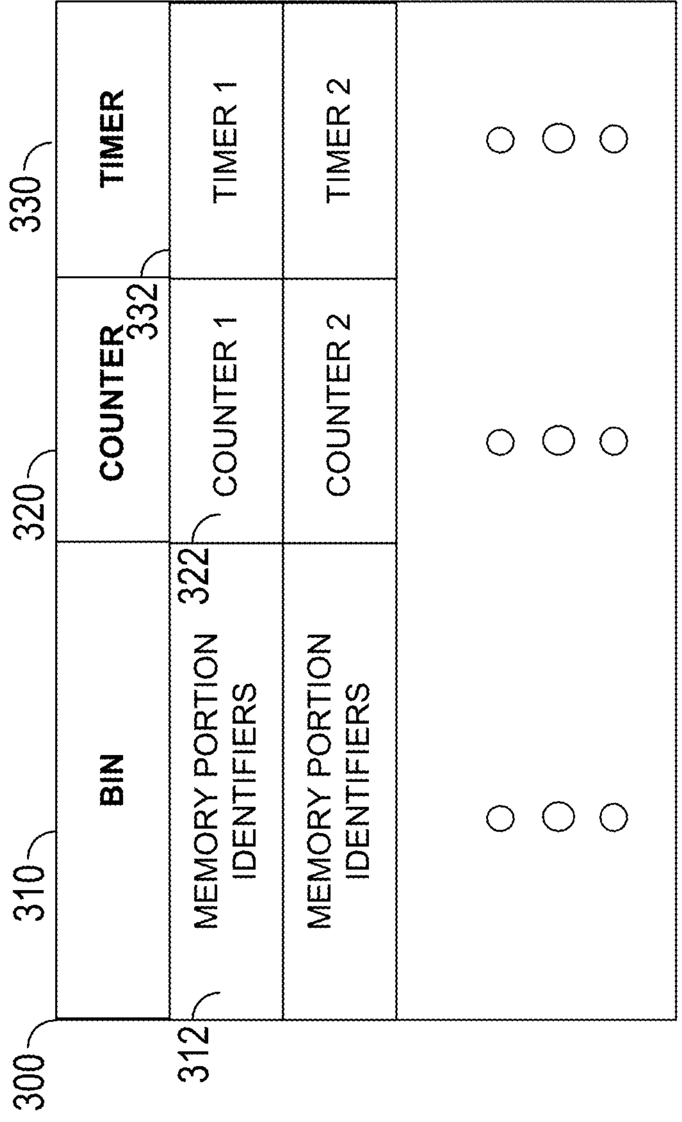
FIG. 3 is a block diagram of an example table identifying potential memory portions with extrinsic bitline defects, in accordance with some examples of the present disclosure.

FIG. 3 is an example table 300 identifying potential memory portions with extrinsic bitline defects, in accordance with some examples of the present disclosure. In some cases, the table 300 can be generated or provided as part of the configuration data 220. The table 300 includes a bins field 310, a counters field 320, and a timers field 330. Specifically, the bins field 310 identifies different groups of memory components 112A to 112N (e.g., by address or other identifier) that are likely to experience extrinsic bitline defects. The counters field 320 represents how many times a certain type of memory operations (e.g., NDEP operations) are performed on memory components 112A to 112N that are associated with a certain bin. The timers field 330 can be used to measure the frequency of performance of the certain type of memory operations, such as by resetting the value of the counters field 320 once a timer reaches a specified value.

Specifically, a set of memory portion identifiers 312 can be stored in association with the bins field 310. This set of memory portion identifiers 312 can correspond to a first bin. The set of memory portion identifiers 312 can be associated with a first counter 322 and a first timer 332. Each time the certain type of memory operations (e.g., the NDEP operation) is performed on one of the memory addresses or memory components 112A to 112N that are associated with the set of memory portion identifiers 312, the value of the first counter 322 is incremented. If the first counter 322 reaches a specified threshold before the first timer 332 reaches the specified value, one or more of the memory components 112A to 112N that are within the set of memory portion identifiers 312 can potentially be marked as bad. In some cases, the very last memory components 112A to 112N within the set of memory portion identifiers 312 that caused the first counter 322 to reach the specified threshold, can potentially be marked as bad (e.g., can be determined to potentially contain an extrinsic bitline defect).

In some examples, prior to marking the memory components 112A to 112N associated with the set of memory portion identifiers 312 as bad (e.g., in response to determining that a frequency of performing the certain types of memory operations transgresses the threshold and/or if the portion of the memory components 112A to 112N or addresses are duplicated in the registers or queue of registers), the extrinsic bitline defect component 230 performs one additional memory operation of the certain type (e.g., one additional NDEP operation) on each of or one or more of the memory components 112A to 112N in the set of memory portion identifiers 312 after erasing each of or one or more of the memory components 112A to 112N in the set of memory portion identifiers 312. The extrinsic bitline defect component 230 can then measure the bit error rate associated with reading data from each of or one or more of the memory components 112A to 112N in the set of memory portion identifiers 312. If the bit error rate corresponds to a high reliability error rate (HRER) which is associated with uncorrectable errors in the set of data, the corresponding memory components 112A to 112N are marked as bad to prevent future writes to the memory components 112A to 112N.

As another example, the extrinsic bitline defect component 230 can determine that the portion of the memory components 112A to 112N is associated with an extrinsic bitline defect based on determining that the same or duplicate addresses are stored in a set of registers. Namely, a specified number of registers can be provided for tracking on which addresses or portions of the memory components 112A to 112N the one or more types of memory operations have been performed. Once the registers are all full, the next memory address is added and replaces the address stored in the first register. Namely, the registers can form a queue of a specified length and addresses or memory portions are added in a round robin manner.

The extrinsic bitline defect component 230 can select the portion of the memory components 112A to 112N on which to perform the one or more types of memory operations (e.g., the NDEP operation). In response, the extrinsic bitline defect component 230 adds the portion or an identifier of the portion to the top or beginning of the queue. Simultaneously, the extrinsic bitline defect component 230 can shift all of the previously stored portion identifiers down the queue of registers and removes the portion identifier stored in the last queue. The extrinsic bitline defect component 230 can then search the queue or registers to determine whether any memory portion identifier (e.g., address) is duplicated. If the extrinsic bitline defect component 230 identifies a memory portion identifier that is duplicated in the register queue, the extrinsic bitline defect component 230 determines that the duplicated memory portion identifier is potentially associated with an extrinsic bitline defect.

Specifically, if an address or memory portion is duplicated in the registers or queue of registers, the extrinsic bitline defect component 230 determines that the address or memory portion is potentially associated with the extrinsic bitline defect. In such cases, the extrinsic bitline defect component 230, prior to marking the memory components 112A to 112N associated with the duplicated memory portion identifier or address, performs one additional memory operation of the certain type (e.g., one additional NDEP operation) on the duplicated memory portion after erasing the memory portion that is duplicated. The extrinsic bitline defect component 230 can then measure the bit error rate associated with reading data from the duplicated memory portion. If the bit error rate corresponds to a high reliability error rate (HRER) which is associated with uncorrectable errors in the set of data, the memory portion that was duplicated is marked as bad to prevent future writes to the memory portion.

These examples can be combined with each other such that the same or different groups of memory components can be marked as potentially associated with extrinsic bitline defects based on frequency of having the one or more types of memory operations performed and/or based on duplication of the memory portions or addresses in the registers or queue of registers.

Figure 4:
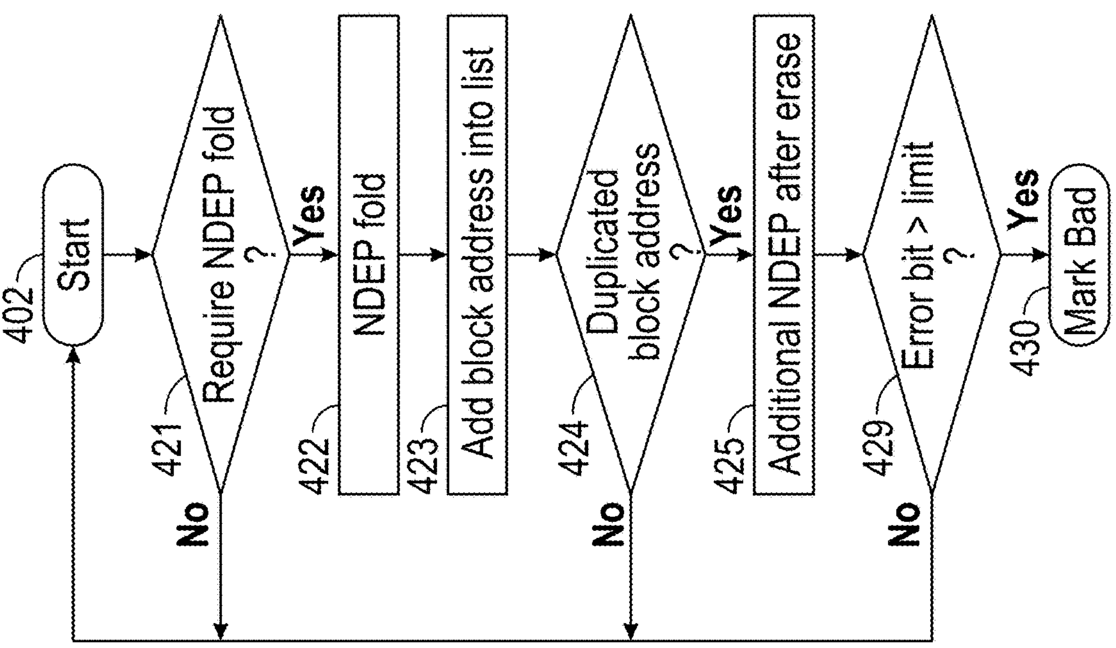
FIGS. 4 and 5 are flow diagrams example methods to perform memory operations to identify memory portions with extrinsic bitline defects, in accordance with some examples of the present disclosure.
Figure 4:
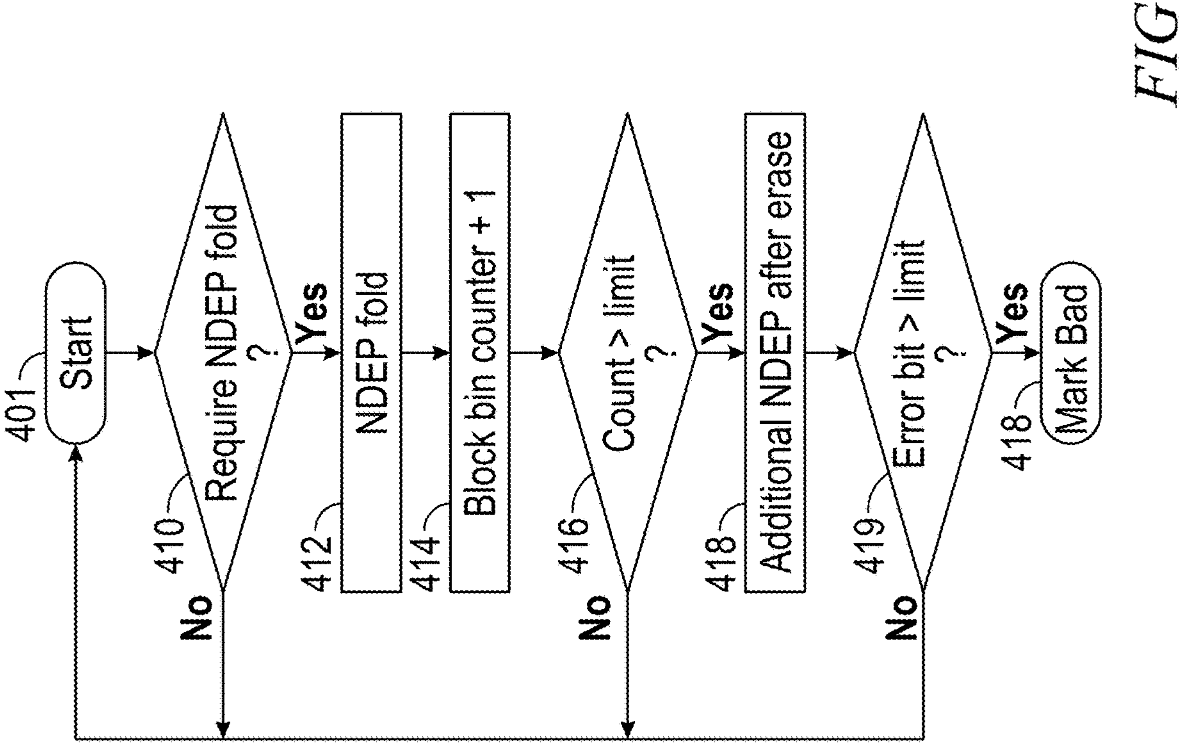

FIG. 4 is a flow diagram of an example processes or methods 401 and 402 to mark memory portions as bad based on determining they are associated with extrinsic bitline defects, in accordance with some implementations of the present disclosure. The processes or methods 401 and 402 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the processes or methods 401 and 402 are performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible. The processes or methods 401 and 402 can be performed in the alternative or in combination with each other.

Referring now to FIG. 4, the method 401 begins at operation 410, with a media operations manager 122 of a memory sub-system (e.g., memory sub-system 110) determining that an individual memory portion requires or needs to be folded based on an NDEP operation. In such cases, the media operations manager 122 performs the NDEP fold operation on the individual memory portion at operation 412. The media operations manager 122 searches the table 300 to determine whether the individual memory portion falls within a certain bin of the bins field 310. The media operations manager 122 can then update/increment the counter value stored in the counters field 320 for the certain bin of the bins field 310 that corresponds to the individual memory portion at operation 414.

Next, the media operations manager 122 determines, at operation 416, whether the current counter value stored in the counters field 320 transgresses a threshold value. If not, the media operations manager 122 returns to operation 410 to continue monitoring for memory portions that need to have NDEP fold operations performed. In response to determining that the current counter value stored in the counters field 320 (corresponding to the bin associated with the individual memory portion) transgresses the threshold value, the media operations manager 122 performs operation 418. At operation 418, the media operations manager 122 performs an additional NDEP fold operation on the individual memory portion after the individual memory portion is erased (e.g., as a result of performing the NDEP fold operation at operation 412). The media operations manager 122 then measures a bit error rate at operation 419 in association with data stored in the individual memory portion and compares the bit error rate to a bit error rate threshold. If the bit error rate transgresses the bit error rate threshold, the media operations manager 122 marks the individual memory portion as bad at operation 420 to prevent future writes to the individual memory portion. Otherwise, the media operations manager 122 returns to performing operation 410. The media operations manager 122 can detect that the timer value stored in the first timer 332 transgresses a specified timer value (e.g., a specified period of time has elapsed). In such cases, the media operations manager 122 can reset the first counter 322 associated with the first timer 332 to remeasure the frequency of performing the NDEP operations on the memory portions that fall within the set of memory portion identifiers 312.

Referring now to method 402, the method 402 begins at operation 421, with a media operations manager 122 of a memory sub-system (e.g., memory sub-system 110) determining that an individual memory portion requires or needs to be folded based on an NDEP operation. In such cases, the media operations manager 122 performs the NDEP fold operation on the individual memory portion at operation 422. The media operations manager 122, at operation 423, adds an identifier of the individual memory portion to a queue of registers (e.g., a list of block addresses), such as at the top of the queue or list. The media operations manager 122, at operation 424, searches the queue or list of registers to determine whether an identifier of the individual memory portion is duplicated or stored in multiple places on the list or queue or registers.

In response to determining that the identifier of the individual memory portion is duplicated or stored in multiple places on the list or queue of registers, the media operations manager 122 performs operation 425. At operation 425, the media operations manager 122 performs an additional NDEP fold operation on the individual memory portion after the individual memory portion is erased (e.g., as a result of performing the NDEP fold operation at operation 422). The media operations manager 122 then measures a bit error rate at operation 429 in association with data stored in the individual memory portion and compares the bit error rate to a bit error rate threshold. If the bit error rate transgresses the bit error rate threshold, the media operations manager 122 marks the individual memory portion as bad at operation 430 to prevent future writes to the individual memory portion. Otherwise, the media operations manager 122 returns to performing operation 421.

Figure 5:
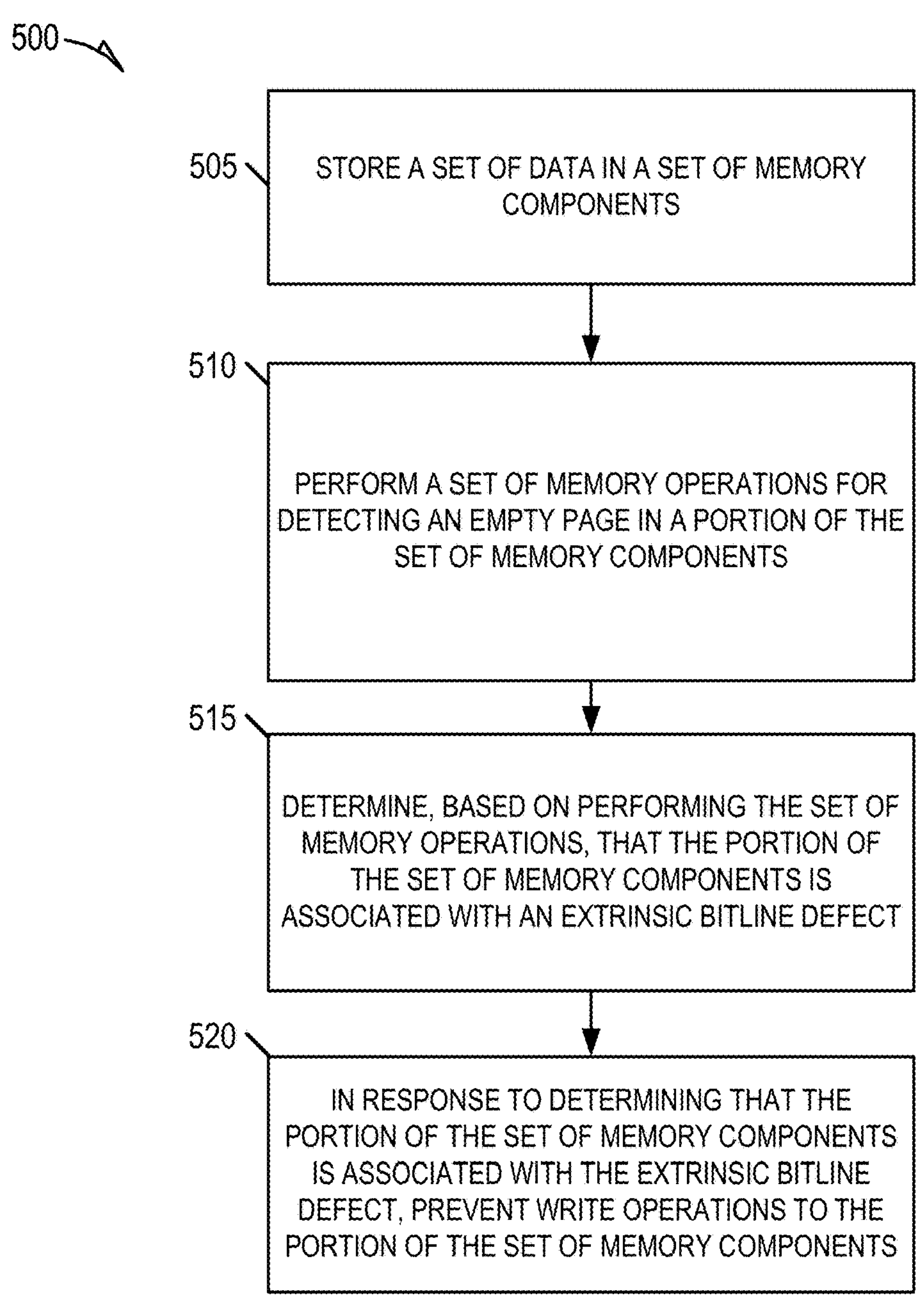

FIG. 5 is a flow diagram of an example process or method 500 to identify memory portions that are potentially associated with extrinsic bitline defects, in accordance with some implementations of the present disclosure. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method 500 is performed by the media operations manager 122 of FIG. 1. Although the processes are shown in a particular sequence or order, unless otherwise specified, the order of the processes can be modified. Thus, the illustrated examples should be understood only as examples, and the illustrated processes can be performed in a different order, and some processes can be performed in parallel. Additionally, one or more processes can be omitted in various examples. Thus, not all processes are required in every example. Other process flows are possible.

Referring now to FIG. 5, the method 500 begins at operation 505, with a media operations manager 122 of a memory sub-system (e.g., memory sub-system 110) storing a set of data in a set of memory components. Then, the media operations manager 122 performs a set of memory operations (e.g., NDEP operations), at operation 510, for detecting an empty page in a portion of the set of memory components. Next, at operation 515, the media operations manager 122 determines, based on performing the set of memory operations, that the portion of the set of memory components is associated with an extrinsic bitline defect (e.g., by performing one or more of the operations of methods 401 and/or 402). The media operations manager 122, in response to determining that the portion of the set of memory components is associated with the extrinsic bitline defects, prevents future write operations from being performed on the portion of the set of memory components at operation 520.

In view of the disclosure above, various examples are set forth below. It should be noted that one or more features of an example, taken in isolation or combination, should be considered within the disclosure of this application.

Example 1. A system comprising: a set of memory components of a memory sub-system; and at least one processing device operatively coupled to the set of memory components, the at least one processing device being configured to perform operations comprising: storing a set of data in the set of memory components; performing a set of memory operations for detecting an empty page in a portion of the set of memory components; determining, based on performing the set of memory operations, that the portion of the set of memory components is associated with an extrinsic bitline defect; and in response to determining that the portion of the set of memory components is associated with the extrinsic bitline defect, preventing write operations to the portion of the set of memory components.

Example 2. The system of Example 1, the operations comprising marking the portion of the set of memory components as a bad block.

Example 3. The system of any one of Examples 1-2, wherein the extrinsic bitline defect corresponds to an open bitline or a stuck bitline that prevents the portion of the set of memory components from being placed into an erased state.

Example 4. The system of any one of Examples 1-3, wherein the extrinsic bitline defect causes undesired charge gain in the portion of the set of memory components.

Example 5. The system of any one of Examples 1-4, wherein the extrinsic bitline defect causes a high reliability error rate (HRER) to be introduced in the portion of the set of memory components.

Example 6. The system of Example 5, wherein the HRER is associated with uncorrectable errors in the set of data stored in the portion of the set of memory components.

Example 7. The system of any one of Examples 1-6, wherein the set of memory operations includes a NAND detect empty page (NDEP) operation.

Example 8. The system of Example 7, wherein the NDEP operation reads a block of data to detect charge gain and refreshes the block of data.

Example 9. The system of any one of Examples 1-8, the operations comprising: accessing configuration information associated with the set of memory components; processing the configuration information to identify a plurality of portions of the set of memory components that are associated with a certain likelihood of having extrinsic bitline defects; and storing a counter in association with the plurality of portions to represent frequency of performing the set of memory operations on the plurality of portions of the set of memory components.

Example 10. The system of Example 9, the operations comprising: determining that the portion of the set of memory components is included in the plurality of portions of the set of memory components that are associated with the certain likelihood of having extrinsic bitline defects.

Example 11. The system of Example 10, the operations comprising: setting a time period in association with updating the counter; and incrementing the counter each time an individual memory operation of the set of memory operations is performed in relation to the plurality of portions of the set of memory components within the time period.

Example 12. The system of Example 11, wherein the counter is reset when the time period expires.

Example 13. The system of any one of Examples 11-12, the operations comprising: determining that the counter transgresses a threshold value before expiration of the time period; and in response to determining that the counter transgresses the threshold value, storing a flag in association with the plurality of portions, the flag corresponding to an instruction to perform an additional one of the set of memory operations after erasing an individual portion of the plurality of portions.

Example 14. The system of Example 13, the operations comprising: after performing an individual memory operation of the set of memory operations on the portion of the set of portions, determining that the portion is associated with the counter that transgresses the threshold value; in response to determining that the portion is associated with the counter that transgresses the threshold value, performing the additional one of the set of memory operations after erasing the portion of the plurality of portions; and computing an error rate associated with performing the additional one of the set of memory operations on the portion of the set of memory components.

Example 15. The system of Example 14, the operations comprising: determining that the error rate transgresses a maximum error rate threshold; and in response to determining that the error rate transgresses the maximum error rate threshold, marking the portion as a bad portion to prevent the write operations to the portion of the set of memory components.

Example 16. The system of any one of Examples 9-15, wherein the plurality of portions correspond to a first bin, wherein the counter is a first counter, and the operations comprising: associating the first bin with the first counter; identifying, based on the configuration information, a second bin of a second plurality of portions of the set of memory components that is associated with the certain likelihood of having extrinsic bitline defects; and associating the second bin with a second counter to represent frequency of performing the set of memory operations on the second plurality of portions of the set of memory components of the second bin.

Example 17. The system of any one of Examples 1-16, the operations comprising: a set of registers for storing addresses in which the set of memory operations have been performed within a specified time period; determining that an individual address corresponding to the portion of the set of memory components is duplicated in the set of registers; in response to determining that the individual address corresponding to the portion of the set of memory components is duplicated in the set of registers, performing an additional one of the set of memory operations after erasing the portion of the set of memory components; and computing an error rate associated with performing the additional one of the set of memory operations on the portion of the set of memory components.

Example 18. The system of Example 17, the operations comprising: determining that the error rate transgresses a maximum error rate threshold; and in response to determining that the error rate transgresses the maximum error rate threshold, marking the portion as a bad portion to prevent the write operations to the portion of the set of memory components.

Example 19. A method comprising: storing a set of data in a set of memory components; performing a set of memory operations for detecting an empty page in a portion of the set of memory components; determining, based on performing the set of memory operations, that the portion of the set of memory components is associated with an extrinsic bitline defect; and in response to determining that the portion of the set of memory components is associated with the extrinsic bitline defect, preventing write operations to the portion of the set of memory components.

Example 20. A non-transitory computer-readable storage medium comprising instructions that, when executed by at least one processing device, cause the at least one processing device to perform operations comprising: storing a set of data in a set of memory components; performing a set of memory operations for detecting an empty page in a portion of the set of memory components; determining, based on performing the set of memory operations, that the portion of the set of memory components is associated with an extrinsic bitline defect; and in response to determining that the portion of the set of memory components is associated with the extrinsic bitline defect, preventing write operations to the portion of the set of memory components.

Methods and computer-readable storage medium with instructions for performing any one of the above Examples.

Figure 6:
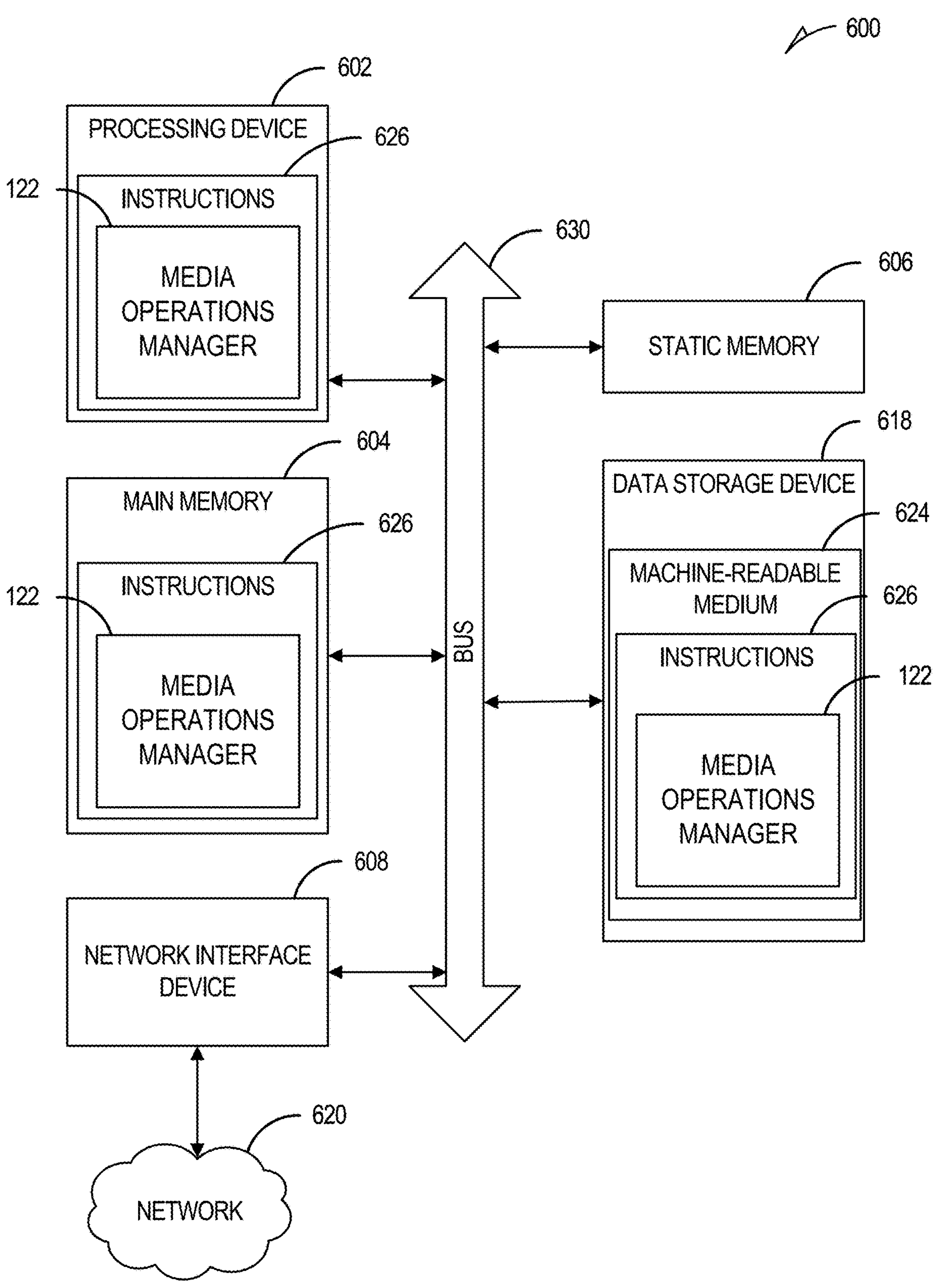
FIG. 6 is a block diagram illustrating a diagrammatic representation of a machine in the form of a computer system within which a set of instructions can be executed for causing the machine to perform any one or more of the methodologies discussed herein, in accordance with some examples of the present disclosure.

FIG. 6 illustrates an example machine in the form of a computer system 600 within which a set of instructions can be executed for causing the machine to perform any one or more of the methodologies discussed herein. In some examples, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 implement functionality corresponding to the media operations manager 122 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a set of memory components of a memory sub-system; and at least one processing device operatively coupled to the set of memory components, the at least one processing device being configured to perform operations comprising:

storing a set of data in the set of memory components;

performing a set of memory operations for detecting an empty page in a portion of the set of memory components;

determining, based on performing the set of memory operations, that the portion of the set of memory components is associated with an extrinsic bitline defect; and in response to determining that the portion of the set of memory components is associated with the extrinsic bitline defect, preventing write operations to the portion of the set of memory components.

2. The system of claim 1, the operations comprising marking the portion of the set of memory components as a bad block.

3. The system of claim 1, wherein the extrinsic bitline defect corresponds to an open bitline or a stuck bitline that prevents the portion of the set of memory components from being placed into an erased state.

4. The system of claim 1, wherein the extrinsic bitline defect causes undesired charge gain in the portion of the set of memory components.

5. The system of claim 1, wherein the extrinsic bitline defect causes a high reliability error rate (HRER) to be introduced in the portion of the set of memory components.

6. The system of claim 5, wherein the HRER is associated with uncorrectable errors in the set of data stored in the portion of the set of memory components.

7. The system of claim 1, wherein the set of memory operations includes a NAND detect empty page (NDEP) operation.

8. The system of claim 7, wherein the NDEP operation reads a block of data to detect charge gain and refreshes the block of data.

9. The system of claim 1, the operations comprising:

accessing configuration information associated with the set of memory components;

processing the configuration information to identify a plurality of portions of the set of memory components that are associated with a certain likelihood of having extrinsic bitline defects; and storing a counter in association with the plurality of portions to represent frequency of performing the set of memory operations on the plurality of portions of the set of memory components.

10. The system of claim 9, the operations comprising:

determining that the portion of the set of memory components is included in the plurality of portions of the set of memory components that are associated with the certain likelihood of having extrinsic bitline defects.

11. The system of claim 10, the operations comprising:

setting a time period in association with updating the counter; and incrementing the counter each time an individual memory operation of the set of memory operations is performed in relation to the plurality of portions of the set of memory components within the time period.

12. The system of claim 11, wherein the counter is reset when the time period expires.

13. The system of claim 11, the operations comprising:

determining that the counter transgresses a threshold value before expiration of the time period; and in response to determining that the counter transgresses the threshold value, storing a flag in association with the plurality of portions, the flag corresponding to an instruction to perform an additional one of the set of memory operations after erasing an individual portion of the plurality of portions.

14. The system of claim 13, the operations comprising:

after performing an individual memory operation of the set of memory operations on the portion of the set of portions, determining that the portion is associated with the counter that transgresses the threshold value;

in response to determining that the portion is associated with the counter that transgresses the threshold value, performing the additional one of the set of memory operations after erasing the portion of the plurality of portions; and computing an error rate associated with performing the additional one of the set of memory operations on the portion of the set of memory components.

15. The system of claim 14, the operations comprising:

determining that the error rate transgresses a maximum error rate threshold; and in response to determining that the error rate transgresses the maximum error rate threshold, marking the portion as a bad portion to prevent the write operations to the portion of the set of memory components.

16. The system of claim 9, wherein the plurality of portions correspond to a first bin, wherein the counter is a first counter, and the operations comprising:

associating the first bin with the first counter;

identifying, based on the configuration information, a second bin of a second plurality of portions of the set of memory components that is associated with the certain likelihood of having extrinsic bitline defects; and associating the second bin with a second counter to represent frequency of performing the set of memory operations on the second plurality of portions of the set of memory components of the second bin.

17. The system of claim 1, the operations comprising:

a set of registers for storing addresses in which the set of memory operations have been performed within a specified time period;

determining that an individual address corresponding to the portion of the set of memory components is duplicated in the set of registers;

in response to determining that the individual address corresponding to the portion of the set of memory components is duplicated in the set of registers, performing an additional one of the set of memory operations after erasing the portion of the set of memory components; and computing an error rate associated with performing the additional one of the set of memory operations on the portion of the set of memory components.

18. The system of claim 17, the operations comprising:

determining that the error rate transgresses a maximum error rate threshold; and in response to determining that the error rate transgresses the maximum error rate threshold, marking the portion as a bad portion to prevent the write operations to the portion of the set of memory components.

19. A method comprising:

storing a set of data in a set of memory components;

performing a set of memory operations for detecting an empty page in a portion of the set of memory components;

determining, based on performing the set of memory operations, that the portion of the set of memory components is associated with an extrinsic bitline defect; and in response to determining that the portion of the set of memory components is associated with the extrinsic bitline defect, preventing write operations to the portion of the set of memory components.

20. A non-transitory computer-readable storage medium comprising instructions that, when executed by at least one processing device, cause the at least one processing device to perform operations comprising:

storing a set of data in a set of memory components;

performing a set of memory operations for detecting an empty page in a portion of the set of memory components;

determining, based on performing the set of memory operations, that the portion of the set of memory components is associated with an extrinsic bitline defect; and in response to determining that the portion of the set of memory components is associated with the extrinsic bitline defect, preventing write operations to the portion of the set of memory components.

* * * * *